US007755020B2

(12) United States Patent
Sakura et al.

(10) Patent No.: US 7,755,020 B2
(45) Date of Patent: Jul. 13, 2010

(54) LIGHT RECEIVING CIRCUIT AND LIGHT COUPLING DEVICE

(75) Inventors: Shigeyuki Sakura, Kanagawa-ken (JP); Hirofumi Kobayashi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 39 days.

(21) Appl. No.: 12/017,745

(22) Filed: Jan. 22, 2008

(65) Prior Publication Data
US 2008/0179496 A1 Jul. 31, 2008

(30) Foreign Application Priority Data
Jan. 25, 2007 (JP) ............................. 2007-014864

(51) Int. Cl.
*H03F 3/08* (2006.01)
(52) U.S. Cl. .................. 250/214 R; 250/214 A
(58) Field of Classification Search ................. 398/209, 398/162; 250/214 A, 214 R
See application file for complete search history.

(56) References Cited

U.S. PATENT DOCUMENTS

| 4,622,586 | A | * | 11/1986 | Megeid | ...................... 348/532 |
| 5,138,148 | A | * | 8/1992 | Sakura | ................... 250/214 A |
| 5,495,358 | A | * | 2/1996 | Bartig et al. | ................. 398/202 |
| 6,888,123 | B2 | * | 5/2005 | Douma et al. | ........... 250/214 R |
| 2007/0126507 | A1 | | 6/2007 | Sakura | |

FOREIGN PATENT DOCUMENTS

JP 2003-258580 9/2003

* cited by examiner

*Primary Examiner*—Georgia Y Epps
*Assistant Examiner*—Tony Ko
(74) *Attorney, Agent, or Firm*—Turocy & Watson, LLP

(57) ABSTRACT

There is provided a light receiving circuit including, a light receiving element outputting electrical current corresponding to input light, and a current-voltage converter having current-voltage conversion characteristic, the current-voltage conversion characteristic becoming smaller at a low frequency side and larger at a high frequency side, the current-voltage converter converting the current to the voltage and outputting the voltage.

13 Claims, 9 Drawing Sheets

LIGHT RECEIVING CIRCUIT AND LIGHT COUPLING DEVICE

CROSS REFERENCE TO RELATED APPLICATION

This application is based upon and claims the benefit of priority from the prior Japanese Application (No. 2007-14864, filed Jan. 25, 2007), the entire contents of which are incorporated herein by reference.

FIELD OF THE INVENTION

The present invention relates to a light receiving circuit and a light coupling memory.

DESCRIPTION OF THE BACKGROUND

For amplifying micro-current in a light receiving element such as a photodiode or the like, the current is generally converted to voltage using an amplifier which has less input bias current and small input off-set voltage and drift voltage. When amplifying the micro current, a circuit system called a transimpedance amplifier is used. In the circuit system, the photodiode is directly inserted into amplifier input-portion.

A conventional light receiving circuit includes an inversion amplifier and a light receiving element, the inversion amplifier having a feedback resistor being connected between an input terminal and an output terminal, the light receiving element being connected with an input terminal of the inversion amplifier.

Further, the conventional light receiving circuit includes a comparator which compares an output of the inversion amplifier and a threshold voltage. Further, the comparator outputs a high-level voltage or a low-level voltage corresponding to the comparison result.

When a pulse optical signal is entered into the light receiving element, a current is provided from the light receiving element into the inversion amplifier corresponding to the optical signal. The current is transformed to voltage in the inversion amplifier and a pulse voltage is output corresponding to the optical signal.

The comparator compares between the pulse voltage and the threshold voltage to detect the pulse voltage above the threshold voltage as optical signal.

However, with increasing optical signal strength entered into the light receiving element, a problem generating a distortion in the pulse voltage wave-form output from the comparator so that the light receiving circuit may malfunction.

Therefore, when a gain of an inversion amplifier is set at a low level, detecting the optical signal becomes difficult with decreasing incident optical signal strength entered into the light receiving element, so that a dynamic range of the light receiving circuit is narrowed.

On the other hand, a light receiving circuit having an automatic-gain control circuit is disclosed, for example, in Japanese Patent Publication (Kokai) No. 2003-258580.

The light receiving circuit disclosed in Japanese Patent Publication (Kokai) No. 2003-258580 includes a pre-amplifier converting a current signal to a voltage signal so as to output, a lower-frequency-region passing filter flattening the voltage signal output from the pre-amplifier so as to output the lower-frequency-region filtration signal. The light receiving circuit performs automatic-gain control by changing a feedback resistance value of the pre-amplifier using the signal through the lower-frequency-region passing filter.

In the other hand, the light receiving circuit disclosed in Japanese Patent Publication (Kokai) No. 2003-258580 performs automatic-gain control on the basis of average strength in the optical signal, however, does not disclose with respect to a problem generated by an overshoot optical signal instantaneously input.

SUMMARY OF INVENTION

According to an aspect of the invention, there is provided a light receiving circuit including, a light receiving element outputting electrical current corresponding to input light, and a current-voltage converter having current-voltage conversion characteristic, the current-voltage conversion characteristic becoming smaller at a low frequency side and larger at a high frequency side, the current-voltage converter converting the current to the voltage and outputting the voltage.

Further, according to another aspect of the invention, there is provided an optical coupling device including, a light-emitting element, and a light receiving circuit, the light receiving circuit including a light receiving element and a current-voltage converter, the light receiving element outputting electrical current corresponding to input light, the current-voltage converter having current-voltage conversion characteristic, the current-voltage conversion characteristic becoming smaller at a low frequency side and larger at a high frequency side, the current-voltage converter converting the current to the voltage and outputting the voltage.

Further, according to another aspect of the invention, there is provided an optical coupling device including a light-emitting element, an optical fiber, and a light receiving circuit, the light receiving circuit including a light receiving element and a current-voltage converter, the light receiving element outputting electrical current corresponding to input light, the current-voltage converter having current-voltage conversion characteristic, the current-voltage conversion characteristic becoming smaller at a low frequency side and larger at a high frequency side, the current-voltage converter converting the current to the voltage and outputting the voltage, wherein the optical fiber combines the light-emitting element with the light receiving circuit and introduces emission light emitted from the light-emitting element into the light receiving circuit.

DETAILED DESCRIPTION OF THE INVENTION

Figure 1:
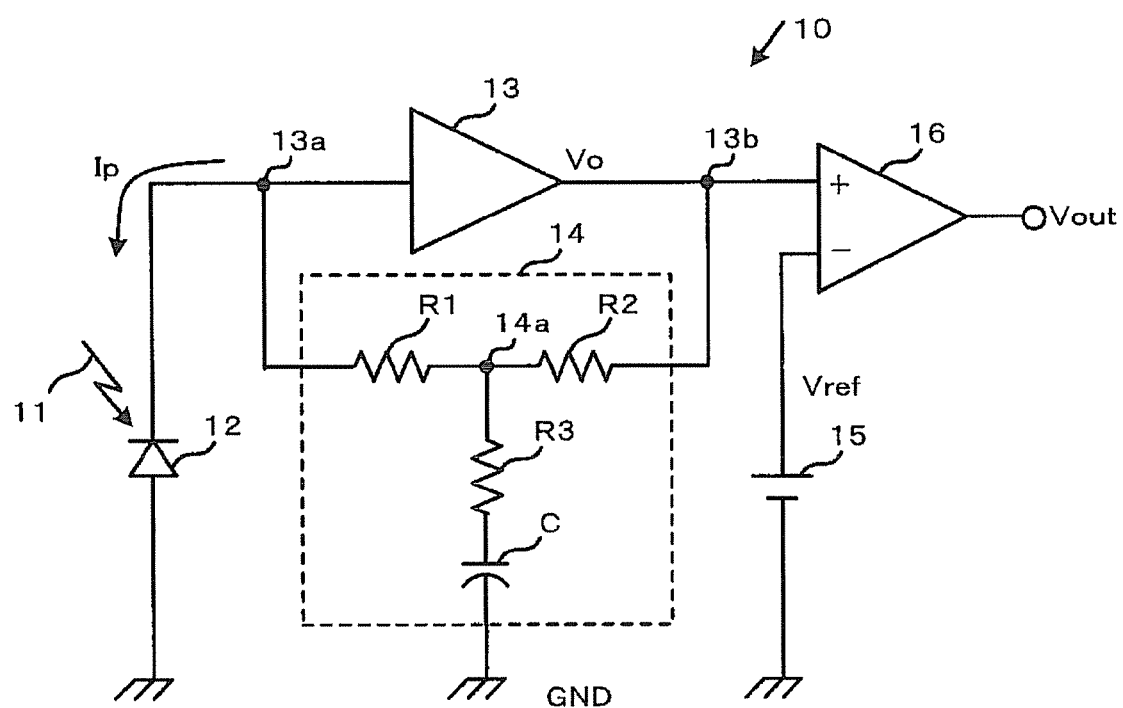
FIG. 1 is a circuit diagram showing a light receiving circuit according to an embodiment of the present invention.

Embodiments of the present invention will be described below in detail with reference to the attached drawings. It should be noted that the present invention is not restricted to the embodiments but covers their equivalents. Throughout the attached drawings, similar or same reference numerals show similar, equivalent or same components.

Embodiment

Figure 2:
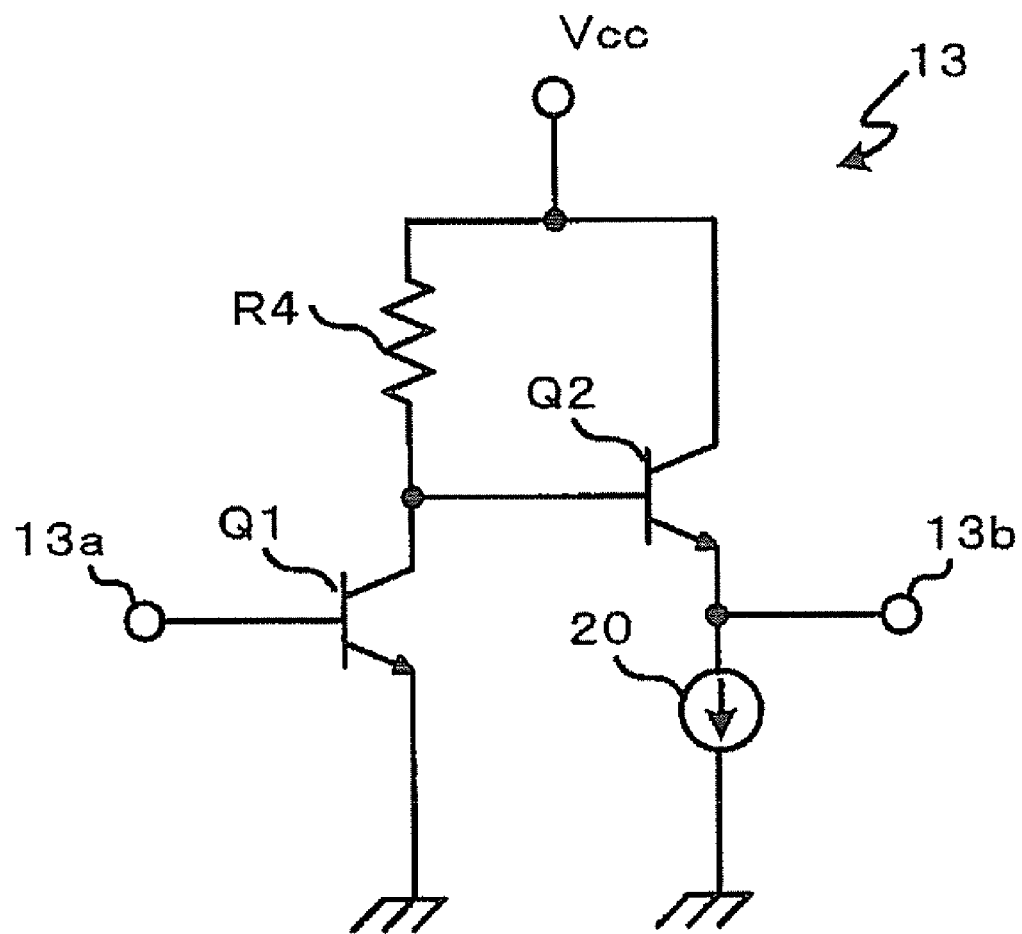
FIG. 2 is a circuit diagram showing an inversion amplifier in the light receiving circuit according to the embodiment of the present invention.
Figure 3:
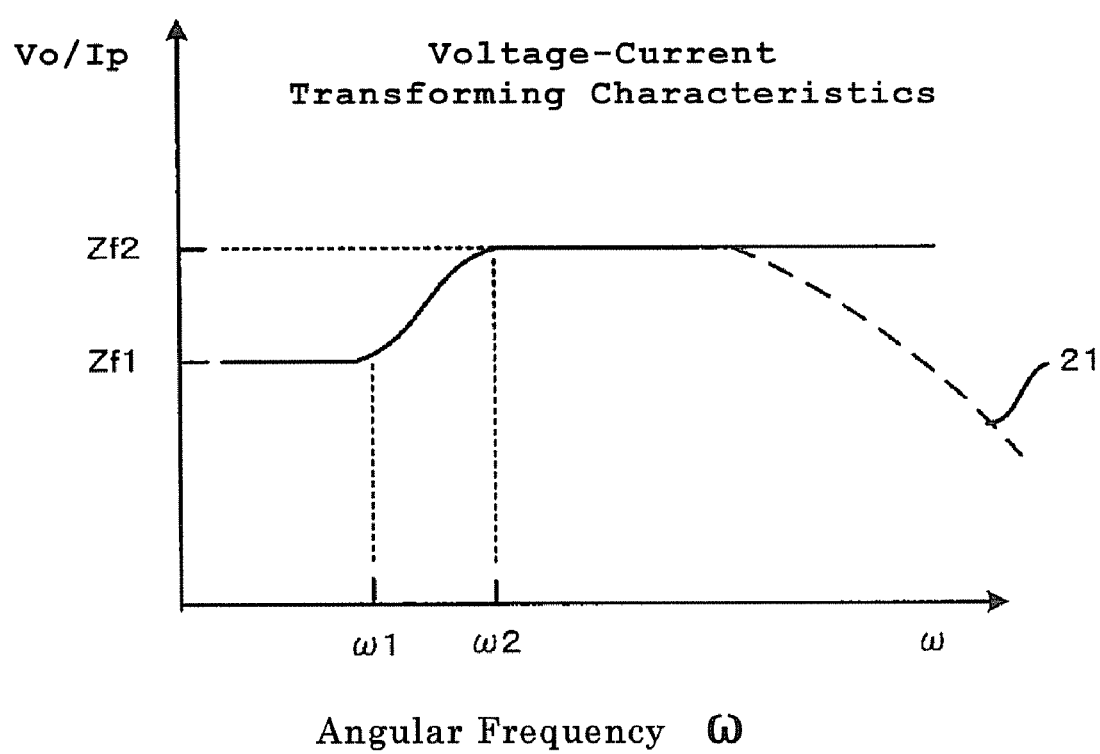
FIG. 3 is a characteristic diagram showing a frequency dependence of a current-voltage conversion characteristic in the light receiving circuit according to the embodiment of the present invention.
Figure 4:
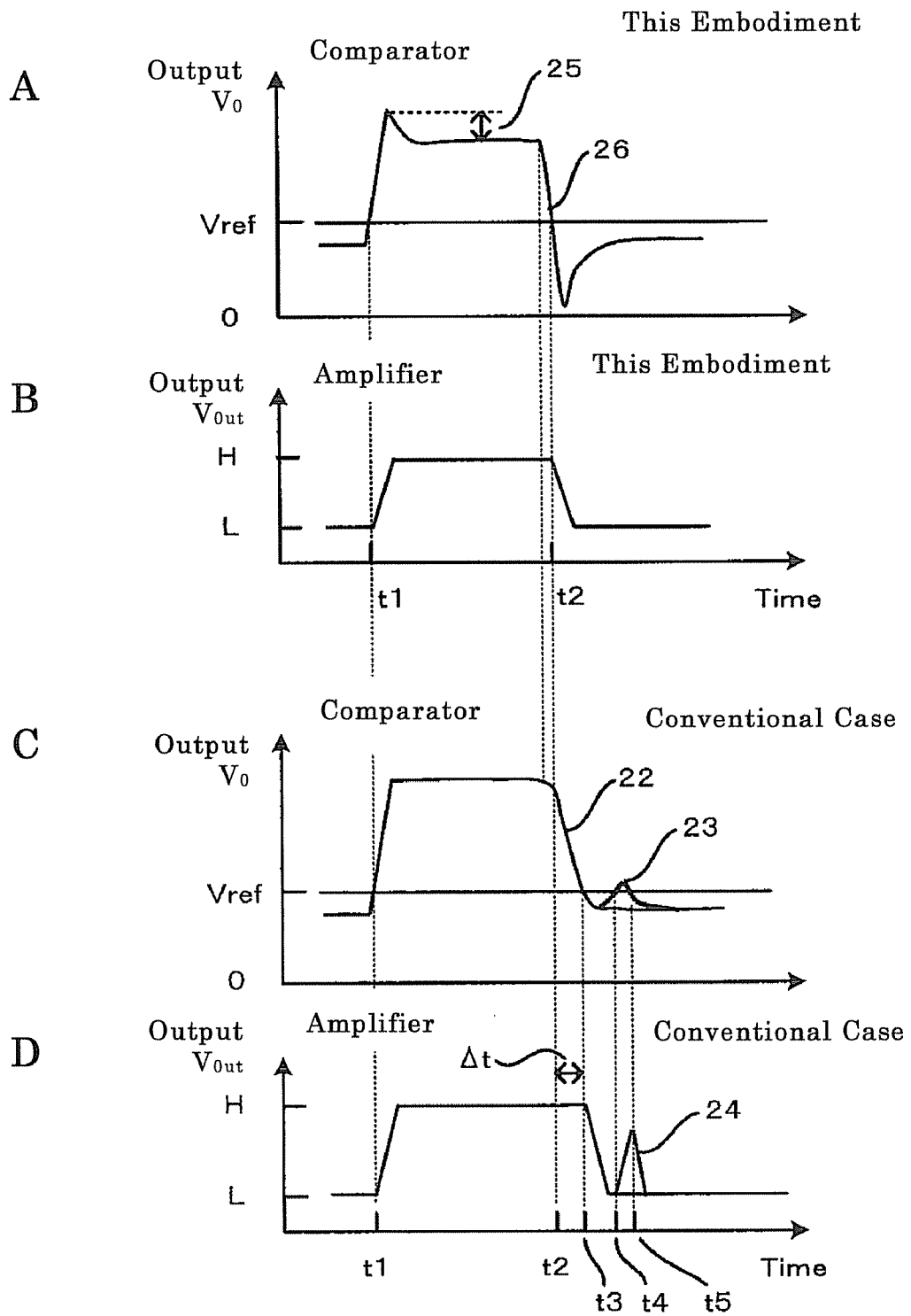
FIGS. 4A-4D are characteristic diagrams showing a time dependence of an output voltage in the light receiving circuit as comparing with conventional case according to the embodiment of the present invention.

First, an optical detecting device according to an embodiment of the present invention will be described below in detail with reference to FIG. 1 and FIG. 4. FIG. 1 is a circuit diagram showing a light receiving circuit according to an embodiment of the present invention. FIG. 2 is a circuit diagram showing an inversion amplifier in the light receiving circuit according to the embodiment of the present invention. FIG. 3 is a characteristic diagram showing a frequency dependence of a current-voltage conversion characteristic in the light receiving circuit according to the embodiment of the present invention. FIGS. 4A-4D are characteristic diagrams showing a time dependence of an output voltage in the light receiving circuit as comparing with conventional case according to the embodiment of the present invention.

As shown in FIG. 1, a light receiving circuit 10 in this embodiment has a light receiving element 12, an inversion amplifier 13 and a feedback circuit 14. The light receiving element 12 outputs current Ip corresponding to strength of an input light 11. An input terminal 13a of the inversion amplifier 13 is connected with the light receiving element 12. The feedback circuit 14 with a frequency characteristic in which transimpedance becomes smaller in a low frequency side and larger in a high frequency side. Further, the feedback circuit 14 feedbacks an output voltage Vo of the inversion amplifier 13 into the input side.

Furthermore, the light receiving circuit 10 has a comparator 16 which includes a non-inversion input terminal (+) being connected with an output terminal 13b of the inversion amplifier 13 and an inversion input terminal (−) being connected with a reference source 15. The comparator 16 compares between a prescribe reference voltage Vref output from the reference source 15 and the output voltage Vo of the inversion amplifier 13. Depending on the compared result, the comparator 16 outputs a voltage Vout of a high-level or a low-level.

Corresponding to a wave length of the input light 11, a silicon photodiode, a PIN photodiode of InGaAs compound, an avalanche photodiode or the like is used as the light receiving element 12.

The feedback circuit 14 includes a first resistor R1, a second resistor R2, a third resistor R3 and a capacitor C. The first resistor R1 and the second resistor R2 are serially connected between an input terminal 13a and an output terminal 13b of the inversion amplifier 13. The third resistor R3 and the capacitor C are serially connected between a ground line GND and a connection point 14a of the first resistor R1 and the second resistor R2. The feedback circuit 14 is a T-type network. An impedance of the feedback circuit 14 is changed corresponding to a frequency of the feedback circuit 14.

As shown in FIG. 2, the inversion amplifying circuit 13 includes an npn-type bipolar transistor Q1 and an npn-type bipolar transistor Q2, hereafter, which is called a transistor Q1 and a transistor Q2, respectively. A base of the transistor Q1 is connected to the light receiving element 12, a collector of the transistor Q1 is connected to an electrical source Vcc via a resistor R4 and an emitter of the transistor Q1 is connected to ground. A base of the transistor Q2 is connected to the collector of transistor Q1, a collector of transistor Q2 is connected to an electrical source Vcc and a constant current source 20 is connected between an emitter of the transistor Q2 and ground. The transistor Q1 is an emitter ground amplifier and the transistor Q2 is emitter follower (collector ground amplifier) with a voltage amplifying ratio nearly being 1.

The light receiving element 12 outputs current Ip corresponding to strength of a receiving input-light 11 and provides the current to the base of transistor Q1. The transistor Q1 transforms the current Ip to voltage and amplifies the voltage. The transistor Q2 outputs output voltage, as a low impedance signal, of the transistor Q1 towards the output terminal 13b.

Fully enlarging a gain of emitter ground amplifier by the transistor Q1, for example, the gain being more than fifty sets voltage amplifying ratio of inversion amplifier 13 by the impedance of the feedback circuit so as to be nearly equal to impedance Zf of the feedback circuit 14. Accordingly, the output signal Vo is equal to Ip×Zf.

A current-voltage conversion characteristic (Vo/Ip) of the inversion amplifier 13 is represented by next equation where junction capacity of the light receiving element 12 is ignored and the inversion amplifier 13 is considered to be an ideal amplifier without frequency dependence.

$$Vo/Ip=(R1+R2)(1+j\omega C(R3+R1R2/(R1+R2)))/(1+j\omega CR3)$$

As the impedance (1/jωC) of the capacitor C is fully large in a low frequency side, the third resistor R3 is cut off from the earth potential GND and becomes a floating state so that the transimpedance Zf of the feedback circuit 14 is equal to R1+R2.

On the other hand, as the impedance (1/jωC) of the capacitor C is fully small in a high frequency side, the third resistor R3 is connected to the ground potential GND so that the transimpedance Zf of the feedback circuit 14 is equal to R1+R2+R1R2/R3.

In the frequency region between the low frequency side and the high frequency, the transimpedance Zf of the feedback circuit 14 is changed corresponding to the impedance of the third resistor R3 and the capacitor C serially connected each other.

As shown in FIG. 3, the current-voltage conversion characteristic (Vo/Ip) is actually according to equation (1), as a result, is equal to R1+R2 in a region where the angular frequency ω is smaller than ω1 being equal to 1/C(R3+R1+R2/(R1+R2)). On the other hand, the current-voltage conversion characteristic (Vo/Ip) is equal to R1+R2+R1R2/R3 in a region where the angular frequency ω is larger than ω2=1/CR3.

Consequently, the feedback circuit 14 having both the larger transimpedance Zf in the low frequency side and the smaller transimpedance Zf in the high frequency side is obtained. However, angular frequency ω being fully larger than ω3 actually decreases the current-voltage conversion characteristic (Vo/Ip) by influence of the frequency characteristic of the inversion amplifier 13 and the junction capacity of the light receiving element 12 as shown at a broken line 21.

FIGS. 4A-4D are characteristic diagrams showing time dependence of the output voltage in the light receiving circuit as comparing between the embodiment of the present invention and a conventional case. FIGS. 4A and 4B show the embodiments of the present invention, and FIGS. 4C and 4D show the conventional case. FIGS. 4A and 4C are timing charts showing a wave-form of the output voltage Vo in the inversion amplifier according to the embodiment of the present invention and the conventional case, respectively. FIGS. 4B and 4D are timing charts showing a wave-form of the output voltage Vout of the comparator according to the embodiment of the present invention and the conventional case, respectively.

In this specification, the conventional light receiving circuit has not the capacitor C as shown in FIG. 1 of the embodiment of the present invention and includes a feedback circuit in which the third resistor R3 is connected between the earth potential GND and a connection point of the first resistor R1 and the second resistor R2. First, the conventional case is explained.

As shown in FIG. 4C according to the conventional case, when the pulse optical signal 11, which means the input light, is input into the light receiving element 12, the output voltage Vo of the inversion amplifier 13 rises up to Ip×Zf1 corresponding to rising of the pulse optical signal 11. The output voltage Vo is retained during the pulse optical signal 11 is irradiated.

When the pulse optical signal 11 falls down, the output voltage Vo also falls down and a skirt wave-form 22 due to a component of a diffusion current in the generation light receiving element 12 generates so that the falling becomes gradual.

The skirt wave-form 22 due to the component of diffusion current is explained below. In a case that the input light is mainly infra-red, the infra-red light deeply penetrates into the light receiving element 12 being over the pn-junction of the light receiving element. Carriers generated at outside of the depletion region in the pn-junction gradually attenuate to generate the skirt wave-form 22.

Furthermore, after the output voltage Vo was felled down, a linking wave-form 23 may be generated due to resonance originated by a parasitic inductance or a floating capacity of the circuit.

As shown in FIG. 4D, the output voltage Vout of the comparator 16 rises up at time t1 when the output voltage Vo of the inversion amplifier 13 becomes larger than reference voltage Vref and falls down at time t3 when the skirt wave-form 22 becomes smaller than reference voltage Vref. As a result, time-delay $\Delta t$ being equal to t3–t2 is generated while the output voltage Vout falls down for time t2 mentioned below.

Furthermore, after the output voltage Vout of the comparator 16 felled down, the output voltage Vout of the comparator 16 rises up at time t4 when the linking wave-form 23 becomes larger than the reference voltage Vref and falls down at time t5 when the linking wave-form 23 becomes smaller than the reference voltage Vref. As a result, a pseudo-pulse 24 is generated.

On the other hand, as shown in FIG. 4A in this embodiment, the output voltage Vo of the inversion amplifier 13 rises up to Ip×Zf2 corresponding to rising the pulse optical signal 11, when the pulse optical signal 11 is entered into the light receiving element 12.

When the pulse optical signal 11 becomes constant, as a component of the current Ip in the high frequency being larger than $\omega 2$ is decreased and a component of the current Ip in the low frequency being smaller than $\omega 1$ is increased, so that the output voltage Vo is gradually lowered to generate sag 25.

When the pulse optical signal 11 falls down, as the component of the current Ip in the low frequency being smaller than $\omega 1$ is increased, the component of the current Ip in the high frequency being larger than $\omega 2$ is decreased, so that the output voltage Vo is rapidly lowered to generate a pullback wave-form 26 being largely swung to lower portion.

As shown in FIG. 4B, the output voltage Vout of the comparator 16 rises up at time t1 when the output voltage Vo becomes larger than the reference voltage Vref, as same as the conventional case. However, the output voltage Vout falls down at faster time t3 in the conventional case and becomes time t2 when the pullback wave-form 26 becomes smaller than the reference voltage Vref.

Consequently, even if the skirt wave-form 22 or the linking wave-form 23 is generated on the wave of the output voltage Vo in the inversion amplifier 13, the falling wave of the output voltage Vo is largely lowered than the reference voltage Vref. Therefore, delay of the falling due to the skirt wave-form 22 and generation of the pseudo-pulse 24 due to the linking wave-form 23 can be suppressed.

The sag 25 and the pullback wave-form 26 do not influence the wave of the output voltage Vout in the comparator 16. Accordingly, the output voltage Vout having a precise wave without distortion can be obtained in independence of the pulse optical signal strength.

Figure 5:
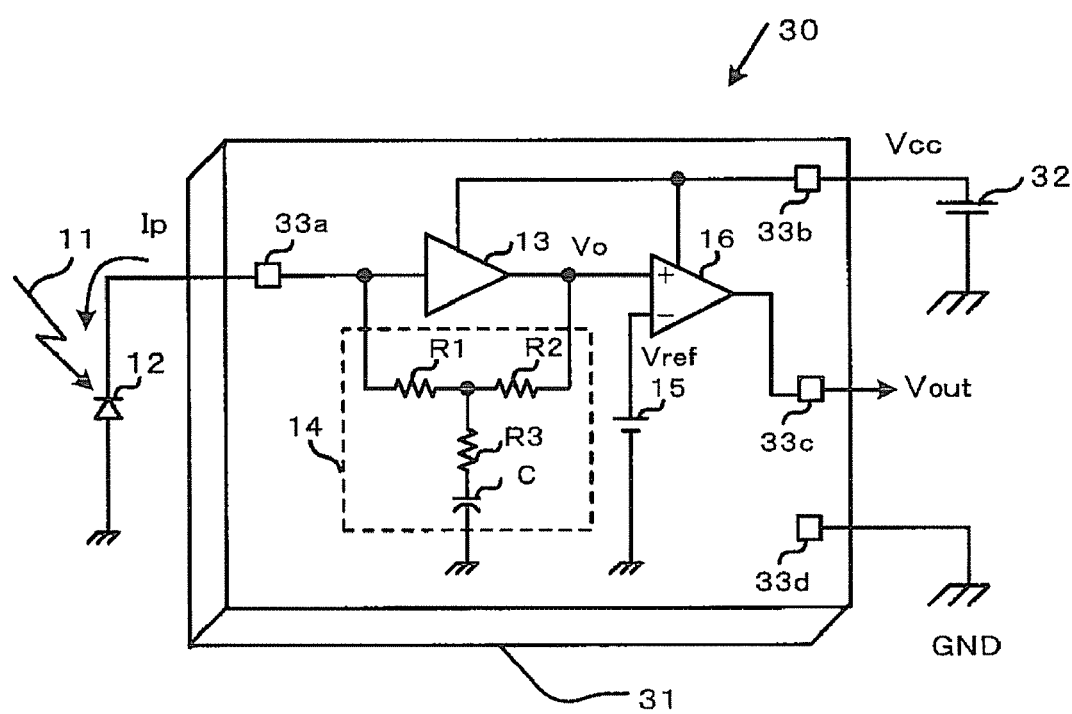
FIG. 5 is a semiconductor integrated circuit including the light receiving circuit according to the embodiment of the present invention.

FIG. 5 is a semiconductor integrated circuit monolithically including the light receiving circuit on a same semiconductor chip according to the embodiment of the present invention. As shown in FIG. 5, a semiconductor integrated circuit 30 in this embodiment of the present invention includes the inversion amplifier 13, the feedback circuit 14, the reference source 15 and the comparator 16 and is monolithically formed on the same chip. The light receiving element 12 is attached outside the semiconductor chip 31.

Further, bonding pads 33a-33d are formed on the semiconductor chip 31. The bonding pads 33a-33d are connected with a current source 32, input the current Ip output from the light receiving element 12, and provides the output voltage Vout from the comparator 16 to an outer region.

Figure 6:
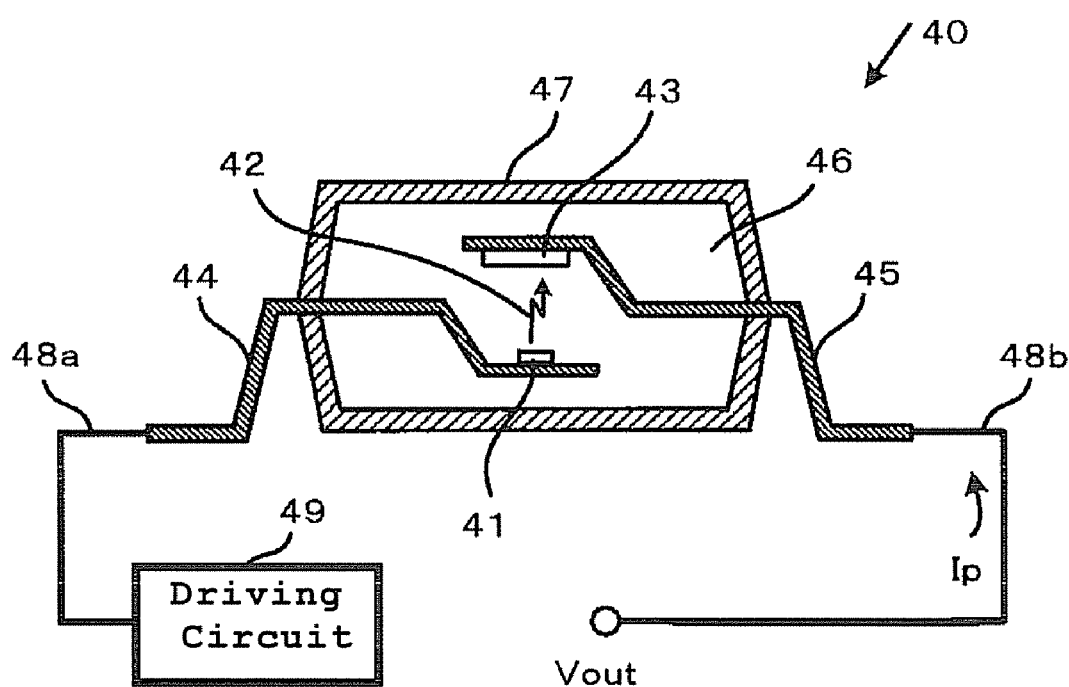
FIG. 6 a perspective view showing an optical coupling circuit according to the embodiment of the invention.

Next, an optical coupling device in this embodiment of the present invention is explained by using FIG. 6. As shown in FIG. 6, another optical coupling device 40 in this embodiment is a photo-coupler being disposed a light-emitting element 41 and a semiconductor circuit 43 with a light receiving element opposed to the light-emitting element 41. The light-emitting element 41 transforms information to optical signal and sends the optical signal to the light receiving element in the semiconductor circuit 43. The light receiving element receives an optical signal 42 sent from the light-emitting element 41.

The light-emitting element 41, for example an infra-red emission diode, is formed of an AlGaAs compound. The semiconductor circuit 43 is a light receiving IC integrating a silicon photodiode as the light receiving element, for example.

The light-emitting element 41 is disposed on a mount-head of a lead frame 44 and is electrically connected with an electrode lead (not illustrated) of the lead frame 44 via a connection conductor (not illustrated). The semiconductor circuit 43 is disposed on a mount-head of the lead frame 45 and is electrically connected with an electrode lead (not illustrated) of the lead frame 45 via a connection conductor (not illustrated).

The light-emitting element 41, the semiconductor circuit 43, the lead frame 44 and the lead frame 45 are molded by transparent resin 46 corresponding to the emission wave length and are integrally-molded by an opaque resin 47 corresponding to the emission wave length. The lead terminals of the terminal lead frames 44, 45 are extended from the sidewall of the opaque resin 47 to outer space.

The light-emitting element 41 is connected to a driver circuit 49 via from the lead terminal 44 via a cable 48a. As same as the light-emitting element 41, the semiconductor integrated circuit 43 is connected to outer portion from the lead terminal 45 via a cable 48b.

The driver circuit 49 provides a pulse current into the light-emitting element 41 and sends the pulse optical signal 42. The semiconductor integrated circuit 43 provides the output signal Vout having a wave corresponding to the current Ip provided from the inner light receiving element to an outer signal processor (not illustrated).

As mentioned above, the light receiving circuit 10 in this embodiment includes the feedback circuit 14 to feedback the output of the inversion amplifier 13 to the input side. The feedback circuit 14 has the frequency characteristic that the transimpedance becomes smaller in the low frequency side and becomes larger in the high frequency side.

Consequently, even if the skirt wave-form 22 originated from the diffusion current or the linking wave-form 23 originated from floating capacity and parasitic inductance is generated on the output voltage Vo in the inversion amplifier 13, the output voltage Vout having a precise wave without distortion can be obtained corresponding to the pulse optical signal 11. Accordingly, the light receiving circuit 10 and the optical coupling device 40 having a wide dynamic range are obtained.

Here, it is explained below as one case. The third resistor R3 is connected with the connection point serially connected the first resistor R1 and the second R2, and the capacitor C is connected to ground. However, the third resistor R3 and the capacitor C may be exchanged each other.

Further, it is also explained below as one case. The T-type network includes the feedback circuit 14 having the first resistor R1 and the second resistor R2 serially connected each other, and having the third resistor R3 and the capacitor C serially connected each other between the ground line GND and the connection point between the first resistor R1 and second resistor R2. However, a feedback circuit having another circuit method may be selected.

Figure 7:
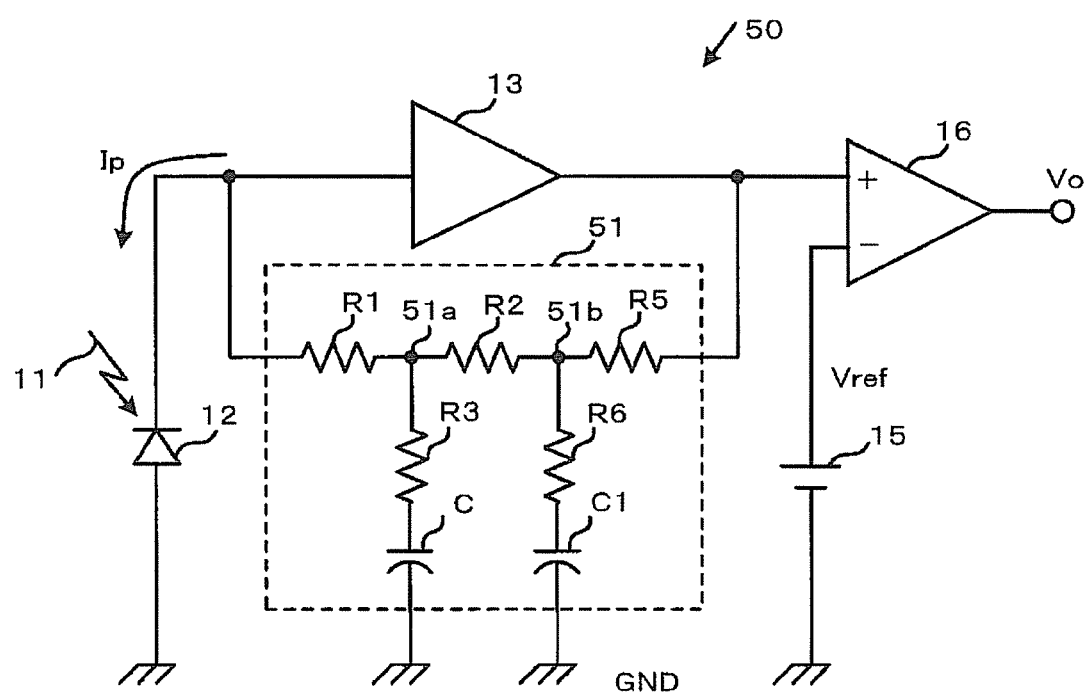
FIG. 7 is a circuit diagram showing another light receiving circuit according to the embodiment of the present invention.

For example, as shown in FIG. 7, a feedback circuit 51 in a light receiving circuit 50 may be constituted of n-type network and may have the first resistor R1, the second resistor R2, a fifth resistor R5, a sixth resistor R6, the capacitor C and a capacitor C1. The first resistor R1, the second resistor R2 and the fifth resistor R5 are serially connected one another. The third resistor R3 and the capacitor C are serially connected between the ground line GND and a connection point 51a between the first resistor R1 and the second resistor R2. The sixth resistor R6 and capacitor C1 are serially connected between the ground line GND and a connection point 51b between the second resistor R2 and fifth resistor R5. According to the feedback circuit 51, an advantage described below is considered. A current-voltage conversion characteristic profile can be variable in the frequency region between the low frequency side and the high frequency side.

Figure 8:
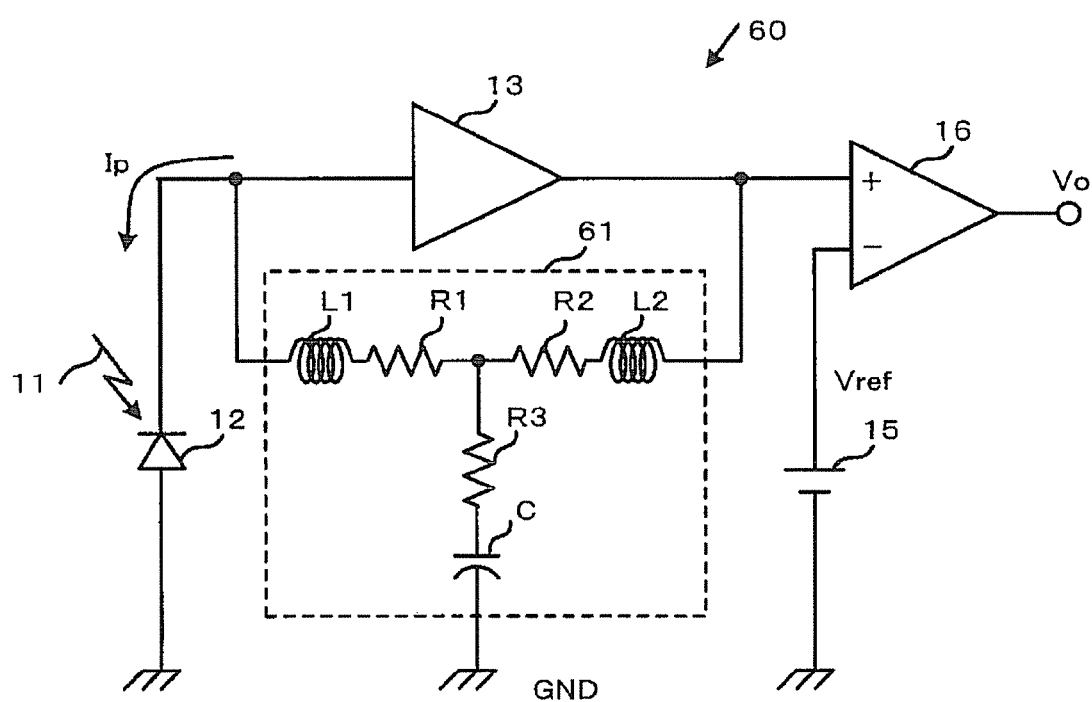
FIG. 8 is a circuit diagram showing another light receiving circuit according to the embodiment of the present invention.

Furthermore, as shown in FIG. 8, a feedback circuit 61 in a light receiving circuit 60 may be constituted of T-type network and may have an inductor L1 being serially connected with the first resistor R1 and an inductor L2 being serially connected with the second resistor R2. According to the feedback circuit 61, an advantage is obtained as mentioned below. As the transimpedance Zf becomes large in the high frequency side, a higher current-voltage conversion characteristic is gained.

Here, it is explained below as one case. The reference source 15 and the comparator 16 are built in the semiconductor integrated circuit 30. However, the reference source 15 and the comparator 16 may be attached at an outer side. In the case, an advantage is obtained as mentioned below. The reference voltage Vref can be freely set at an outer side corresponding to a level of the input light 11.

Here, it is explained below as one case. The light receiving element 12 is set at outside the semiconductor chip 31. However, the light receiving element 12 is built in the semiconductor chip 31. In the case, an advantage is obtained as mentioned below. In the case that the light receiving element 12 is a silicon photodiode, the circuits are monolithically integrated in the semiconductor chip 31.

Here, it is explained below as one case. In the light receiving circuit 10, the inversion amplifier 13 and the comparator 16 are directly connected. However, the amplifier amplified the output voltage Vo, the level-shift circuit shifting a level of the output voltage Vo or both the amplifier and the level-shift circuit is connected between the inversion amplifier 13 and the comparator 16. In the case, an advantage is obtained as mentioned below. A dynamic range of the output voltage Vo in the inversion amplifier 13 is widened and the reference source 15 and the comparator 16 are easily designed.

Here, it is explained below as one case. The reference voltage Vref is fixed. However, a light receiving circuit system having variable reference voltage Vref depending on the strength of the input light 11 is also used. In the case, an advantage is obtained as mentioned below. A margin to the pseudo-pulse 24 can be increased.

Here, it is explained below as one case. The transistors Q1 and Q2 of the inversion amplifier 13 are npn-type bipolar transistors. However, pnp-type bipolar transistors can be used as a circuit constitution. An insulator-gate field-effect-transistor (MOS transistor) can be used as the inversion amplifier 13a. In the case of the MOS transistor, voltage amplifying ratio is not so much as bipolar transistor, however, MOS transistor can be operated without any problem.

Here, it is explained below as one case. The first resistor R1, the second resistor R2 and the third resistor R3 are the resistance elements. However, general impedance element can be widely selected. For example, a transistor can be used as the resistance element.

Here, it is explained below as one case. The optical coupling device 40 is a photo-coupler with the opposite type. However, the optical coupling device 40 is the photo-coupler with the reflection.

Figure 9:
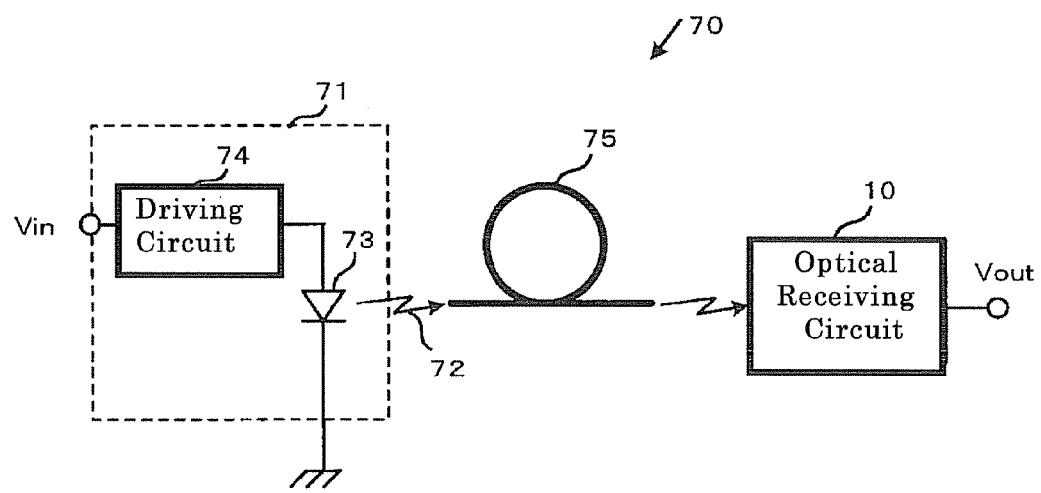
FIG. 9 is a block diagram showing another light coupling device according to the embodiment of the present invention.

Further, an optical coupling device having a light-emitting element and a light receiving element combined with an optical fiber may be used. For example, as shown in FIG. 9, the optical coupling device 70 includes a light-transmitting circuit 71 transforming information to the optical signal and sending the optical signal, and the light receiving circuit 10 receiving the optical signal 72 sent from the light transmitting circuit 71.

The light transmitting circuit 71 includes a light-emitting element 73 irradiating the optical signal 72, for example a semiconductor laser and a driver circuit 74 getting a signal Vin from an outer portion and electrically driving the light-emitting element 73.

The optical signal 72 sent from the light-transmitting circuit 71, for example propagating in an optical fiber 75, enters into the light receiving circuit 10. The light receiving circuit 10 receives the optical signal 72 on the light receiving element 12, transforms the optical signal to the electrical signal and provides an outer signal processor (not illustrated).

Other embodiments of the present invention will be apparent to those skilled in the art from consideration of the specification and practice of the invention disclosed herein. It is intended that the specification and example embodiments be considered as exemplary only, with a true scope and spirit of the invention being indicated by the claims that follow. The invention can be carried out by being variously modified within a range not deviated from the gist of the invention.

What is claimed is:

1. A light receiving circuit comprising;
   a light receiving element outputting electrical current corresponding to input light; and
   a current-voltage converter having current-voltage conversion characteristic, the current-voltage conversion characteristic becoming smaller at a low frequency side and larger at a high frequency side, the current-voltage converter converting the current to the voltage and outputting the voltage, the current-voltage converter including an inversion amplifier and a feedback circuit, an input of the inversion amplifier being connected with the light receiving element, the feedback circuit feeding back an output of the inversion amplifier to the input of the inversion amplifier, the feedback circuit having transimpedance in frequency characteristic, the transimpedance becoming smaller at a low frequency side and larger at a high frequency side, wherein the feedback circuit includes two first resistors, a second resistor and a capacitor, the two first resistors being serially connected each other between an output terminal of the inversion amplifier and the input terminal of the inversion amplifier, the second resistor and the capacitor being serially connected between a ground line and a connection point between the two first resistors.

2. The light receiving circuit of claim 1, further comprising;
a comparator, one input terminal of the comparator being connected with the output terminal of the inversion amplifier, the other input terminal of the comparator being connected with an reference source outputting a prescribe reference voltage, the comparator comparing between an output voltage of the inversion amplifier and outputting a comparison result.

3. The light recsMng circuit of claim 2, wherein
the inversion amplifier, the feedback circuit and the comparator are disposed on one semiconductor chip.

4. The light receiving circuit of claim 3, wherein
the light receiving element Is included in the semiconductor chip.

5. The light receiving circuit of claim 1, wherein
the feedback circuit includes more than three first resistors, a plurality of second resistors and a plurality of capacitors, the first resistors being serially connected between the output terminal of the inversion amplifier and the input terminal of the inversion amplifier, each of the second resistors and each of capacitors being serially connected between the ground line and connection points between the first resistors.

6. The light receiving circuit of claim 1, further comprising;
two inductors being included in the feedback circuit, each of the inductors being paired with each of the first resistors, the connection point being between the two pairs.

7. The light receiving circuit of claim 1, wherein
each of the first resistors and the second resistor is constituted of a MOS element.

8. An optical coupling device comprising:
a light-emitting element, and
a light receiving circuit, the light receiving circuit including a light receiving element and a current-voltage converter, the light receiving element outputting electrical current corresponding to input light, the current-voltage converter having current-voltage conversion characteristic, the current-voltage conversion characteristic becoming smaller at a low frequency side and larger at a high frequency side, the current-voltage converter converting the current to the voltage and outputting the voltage, the current-voltage converter including an inversion amplifier and a feedback circuit, an input of the inversion amplifier being connected with the light receiving element, the feedback circuit feeding back an output of the inversion amplifier to the input of the inversion amplifier, the feedback circuit having transimpedance in frequency characteristic, the transimpedance becoming smaller at a low frequency side and larger at a high frequency side, wherein the feedback circuit includes two first resistors, a second resistor and a capacitor, the two first resistors being serially connected each other between an output terminal of the inversion amplifier and the input terminal of the inversion amplifier, the second resistor and the capacitor being serially connected between a ground line and a connection point between the two first resistors.

9. The optical coupling device of claim 8, further comprising;
a comparator being included in the light receiving circuit, one input terminal of the comparator being connected with the output terminal of the inversion amplifier, the other input terminal of the inversion amplifier being connected with an reference source outputting a prescribe reference voltage, the comparator comparing between an output voltage of the inversion amplifier and outputting a comparison result.

10. The optical coupling device of claim 9, wherein
the inversion amplifier, the feedback circuit and the comparator are disposed on one semiconductor chip.

11. The optical coupling device of claim 10, wherein
the light receiving element is included in the semiconductor chip.

12. An optical coupling device comprising;
a light-emitting element;
an optical fiber; and
a light receiving circuit, the light receiving circuit including a light receiving element and a current-voltage converter, the light receiving element outputting electrical current corresponding to input light, the current-voltage converter having current-voltage conversion characteristic, the current-voltage conversion characteristic becoming smaller at a low frequency side and larger at a high frequency side, the current-voltage converter converting the current to the voltage and outputting the voltage, the current-voltage converter including an inversion amplifier and a feedback circuit, an input of the inversion amplifier being connected with the light receiving element, the feedback circuit feeding back an output of the inversion amplifier to the input of the inversion amplifier, the feedback circuit having transimpedance in frequency characteristic, the transimpedance becoming smaller at a low frequency side and larger at a high frequency side;

wherein the optical fiber combines the light-emitting element with the light receiving circuit and introduces emission light emitted from the light-emitting element into the light receiving circuit; and the feedback circuit includes two first resistors, a second resistor and a capacitor, the two first resistors being serially connected each other between an output terminal of the inversion amplifier and the input terminal of the inversion amplifier, the second resistor and the capacitor being serially connected between a ground line and a connection point between the two first resistors.

13. The optical coupling device of claim 12, further comprising;
a light transmitting circuit including the light-emitting element and a driver circuit.

* * * * *